United States Patent [19]

Yoshimoto et al.

[11] Patent Number: 4,581,617

[45] Date of Patent: Apr. 8, 1986

[54] METHOD FOR CORRECTING BEAM INTENSITY UPON SCANNING AND RECORDING A PICTURE

[75] Inventors: Takeshi Yoshimoto; Masanari Tsuda, both of Kyoto; Yoshikazu Masuda, Osaka; Masakatsu Yokoi, Kyoto, all of Japan

[73] Assignee: Dainippon Screen Seizo Kabushiki Kaisha, Kyoto, Japan

[21] Appl. No.: 569,449

[22] Filed: Jan. 9, 1984

[30] Foreign Application Priority Data

Jan. 18, 1983 [JP] Japan .................................. 58-5280

[51] Int. Cl.[4] ............................................. G01D 9/42
[52] U.S. Cl. .................................... 346/108; 369/116
[58] Field of Search .................. G11B/7/00; 346/1.1, 346/107 R, 108, 160; 369/116

[56] References Cited

U.S. PATENT DOCUMENTS

| | | | |
|---|---|---|---|
| 3,787,888 | 1/1974 | Haskal | 346/108 |
| 4,093,961 | 6/1978 | Kanamaru | 369/116 |
| 4,283,785 | 8/1981 | Miyauchi | 369/116 |
| 4,470,075 | 9/1984 | Yoshimoto | 346/108 |

Primary Examiner—E. A. Goldberg
Assistant Examiner—Mark Reinhart
Attorney, Agent, or Firm—Zarley, McKee, Thomte, Voorhees & Sease

[57] ABSTRACT

A method for automatically correcting variations in intensity of laser beams output from a projection lens, which variations occur due to variations of a spectrum pattern of optical fibers when their tip portions move, by paying attention to each of focal points of an image sensor which focal points correspond respectively to the optical fibers, comparing the sum of signal outputs from regions of the image sensor, which regions correspond respectively to the laser beams, with a signal output corresponding to a standard beam intensity required for the exposure of a photosensitive material to determine a value to be corrected, and then feeding the value back to acousto-optic light modulators so as to change the modulation efficienties of the acousto-optic light modulators.

1 Claim, 15 Drawing Figures

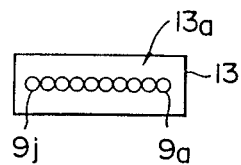
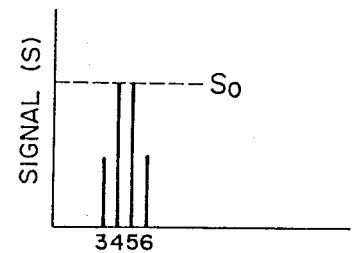
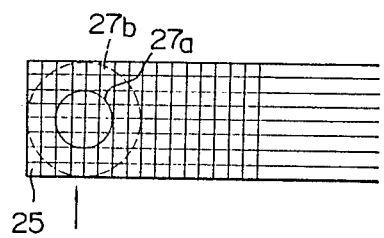
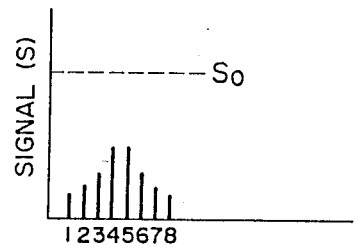
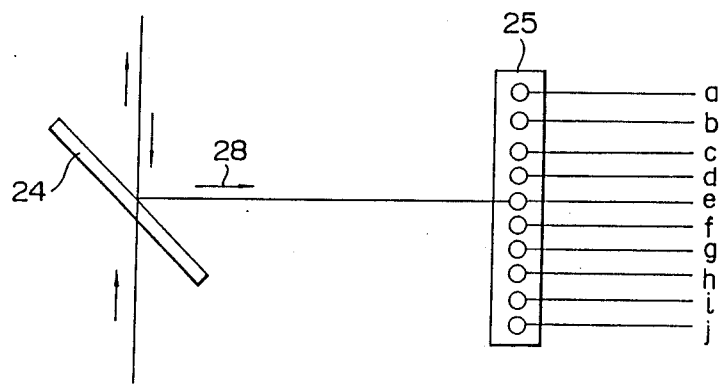

METHOD FOR CORRECTING BEAM INTENSITY UPON SCANNING AND RECORDING A PICTURE

BACKGROUND OF THE INVENTION

1. Field of the Invention

This invention relates to a method for correcting the intensity of each beam upon making a record by means of a picture scanning and recording system, and more specifically to a method for adjusting the intensity of each laser beam output from each optical fiber and correcting same to a standard beam intensity in a recording unit having an optical system which is constructed by connecting, with a plurality of optical fibers, a fixed optical system equipped with means to generate a plurality of laser beams and AOMs (Acousto-optic light modulators) adapted to regulate the intensities of the laser beams and a mobile optical system in which a projection lens is displaceable parallel to the axis of a recording drum so as to subscan the recording drum.

2. Description of the Prior Art

In a picture scanning and recording system for graphic arts, a reproduced picture image of an original picture is recorded on a photosensitive material such as film by photoelectrically scanning the original picture, halftone-processing the resultant signals to obtain picture signals, and then scanning the photosensitive material placed in the recording unit so as to record the picture signals on the photosensitive material.

FIG. 1 is a fragmentary schematic view showing a recording unit useful in the practice of this invention.

A laser beam 2 radiated from a laser 1 is split into a plurality of laser beams 4a–4j by means of a plurality of beam splitters 3, followed by their optical modulation by a plurality of acousto-optic light modulators (AOMs) 5a–5j.

Laser beams 6a–6j, which have been adjusted or regulated in beam intensity by the acousto-optic light modulators, are then caused by their corresponding apertured plates 7 and lenses 8 to enter incident portions 11 of a plurality of optical fibers 9a–9j respectively.

A fixed optical system 12 is constructed of the laser 1 and incident portions 11 as well as each of the members interposed therebetween.

Tip portions 13a of the optical fibers 9a–9j are, as illustrated in FIG. 2, held in a state aligned in a row by a holder 13 mounted on a movable carrier 14.

A recording drum 16, on the circumference of which a recording film 15 is applied, rotates in a direction indicated by an arrow 17. A projection lens 18 projects beams from the tip portions 13a of the fibers 9a–9j on the film 15 so that the recording of each picture is carried out.

A support 19, on which the projection lens 18 is supported, is mounted on the movable carrier 14 in such a way that the support 19 can advance and retreat in directions indicated respectively by arrows 21, 22, in other words, in the direction of a normal line of the recording drum 16. The movable carrier 14 may be reciprocated in parallel with the longitudinal axis of the recording drum 16, as indicated by an arrow. 23.

A half mirror 24 is fixedly disposed between the tip portions 13a of the optical fibers and the projection lens 18, whereby to reflect each beam, which has been reflected back from the film 15, toward an image sensor (photoelectric sensor) 25. The image sensor 25 is fixedly mounted on the movable carrier 14 at a position optically and practically equivalent to the locations of the tip portions 13a of the optical fibers relative to the half mirror 24.

The recording of each picture on the film 15 is carried out by moving an mobile optical system 26 in the direction indicated by the arrow 23 while rotating the recording drum 16.

A part of the image sensor 25 is depicted in FIG. 3. Beams, which have passed out of the fibers 9a–9j, are detected by the image sensor 25.

So long as images, produced at the tip portions 13a of the optical fibers, are projected precisely on the surface of the film 15 by the projection lens 18, images which are produced on the image sensor 25 are well-defined images having the same dimensions as the images 9a–9j actually produced at the tip portions 13a of the optical fibers, as shown by a solid circle 27a. When the images are not correctly focused on the surface of the film, poorly-defined images are produced on the image sensor 25 as indicated by dashed circles 27b.

Here, the output signals of the image sensor 25 are concentrated at a central part and give a maximum value $S_0$ as shown in FIG. 4a when the focusing is correct. When the focusing is incorrect on the other hand, the output signals are scattered and the value of the central part is smaller than the maximum value $S_0$, as illustrated in FIG. 4b.

In FIG. 5, all the ten optical fibers 9a–9j are lightened, and laser beams 28 which have been reflected back from the film 15 are detected by the image sensor 25. "Circles" indicated respectively by letters a–j designate optical fibers 9a–9j.

The fixed optical system 12 and mobile optical system 26 of the recording unit, both of which systems are illustrated in FIG. 1, are connected together by the optical fibers 9a–9j as mentioned above. When the tip portions 13a of the fibers and the projection lens 18, which are both contained in the mobile optical system 26, move in the direction indicated by the arrow 23, the spectrum pattern of the outputs of the fibers changes and the intensity of each beam output from the lens is thus varied, thereby raising a danger that the recording operation on the film 15 may be hampered.

SUMMARY OF THE INVENTION

An object of this invention is to provide a method for automatically correcting variations in intensity of laser beams output from a projection lens which variations occur due to variations of a specturm pattern of optical fibers when tip portions of the optical fibers move, by paying attention to each of focal points a–j on an image sensor 25, comparing the sum of signal outputs from regions of the image sensor, which regions correspond respectively to the laser beams, with a signal output corresponding to a standard beam intensity required for the exposure of a photosensitive material 15 to determine a value to be corrected, and then feeding the value back to acousto-optic light modulators so as to change the modulation efficiencies of the acousto-optic light modulators.

In one aspect of this invention, there is thus provided a method for correcting the beam intensity upon scanning and recording a picture by means of a picture scanning and recording system which produces, on the basis of a picture signal, a halftone signal consisting of at least one parallel operation signal, causing at least one exposing laser beam, which has been modulated by at least one acousto-optic light modulator controlled by the halftone signal, to enter the input terminal of at least one optical fiber, tip portions of the output terminals of which optical fibers are aligned in a row where the system is equipped with more than one optical fiber, and projecting the thus-transmitted beam form the tip portion of the optical fiber on a recording drum, which method comprises:

fixedly providing a half mirror between a lens, which is adapted to focus the thus-transmitted beam on the recording drum, and the tip portion of the optical fiber;

focusing an image, which has been produced at the tip portion of the optical fiber, on at least one photoelectric sensor via the half mirror; and feeding an output signal of the photoelectric sensor, which output signal varies when the spectrum pattern of each output of the optical fiber varies as the output terminal of the optical fiber moves and the optical axis of the optical fiber thus changes, back to the acousto-optic light modulator so that the intensity of the exposing laser beam is corrected to the standard beam intensity required to expose a photosensitive material applied on the recording drum.

The method of this invention has successfully achieved the object of this invention.

The above and other objects, features and advantages of the present invention will become apparent from the following description and the appended claims, taken in conjunction with the accompanying drawings.

BRIEF DESCRIPTION OF THE DRAWINGS

In the accompanying drawings:

FIG. 2 is a front view of the tip portions of the optical fibers of FIG. 1;

FIG. 3 is a front view illustrating a part of an image sensor;

FIGS. 4a and 4b are each a histogram showing the state of signals output from the image sensor;

FIG. 5 is a front view showing the manner of beam reception by the image sensor;

DETAILED DESCRIPTION OF THE INVENTION

One embodiment of this invention will hereinafter be described with reference to each of FIG. 6 and its subsequent figures of the drawings.

Figure 8:
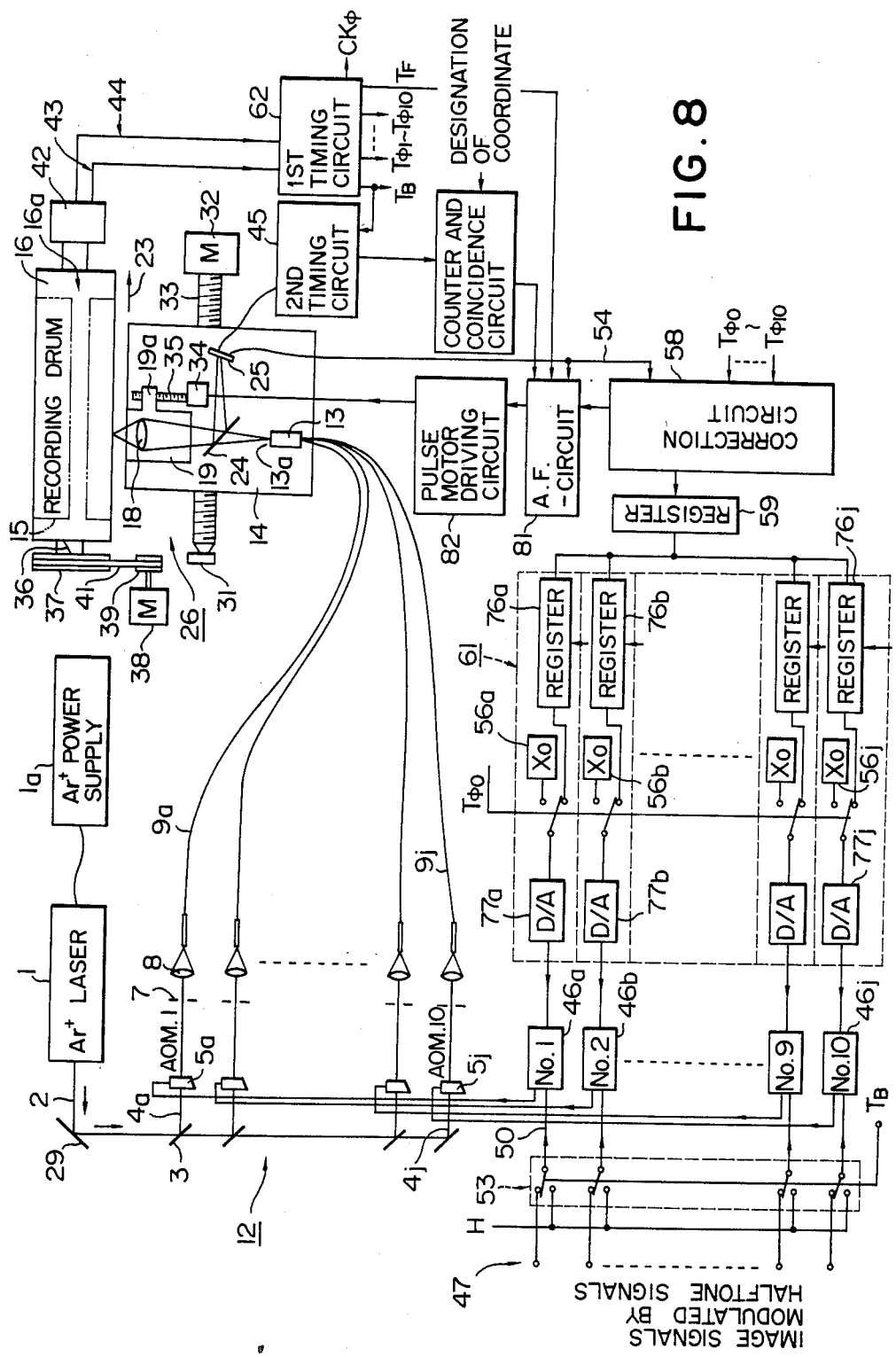
FIG. 8 is a plan view of an image scanning and recording system, in which there is also shown an electric circuit diagram useful in the practice of the beam intensity correction method of this invention.

FIG. 8 is an overall block diagram of a system useful in the practice of the present invention. A laser beam 2, produced by a laser 1 which is driven by a power supply 1a, is reflected by a reflector 29 and then split into a plurality of laser beams 4a-4j (ten laser beams in the illustrated embodiment) by means of a plurality of beam splitter 3 as described above.

The movable carrier 14 is displaceable in parallel with the longitudinal axis of the recording drum 16 by rotation of a feed screw 33 which is supported at both ends thereof by a support member 31 and the drive shaft of a motor 32 respectively.

A fine feed screw 35, which is turned by a pluse motor 34, is threadedly engaged with an arm 19a of the support 19 and serves to cause the projection lens 18 to advance and retreat in the direction of the normal line of the drum 16.

A shaft 36, on which the drum 16 is fixed, is supported by unillustrated bearings. A driven pulley 37 which is fixedly attached to one end of the shaft 36 is connected via a belt 41 to a drive pulley 39 fixedly secured on the drive shaft of a motor 38.

On the other end portion of the shaft 36, there is provided a rotary encoder 42 which outputs a 1-pulse signal and an n-pulse signal, which are respectively indicated by numerals 43 and 44, per each rotation of the drum 16.

As the image sensor 25 which assumes a position optically and practically equivalent to the positions of the tip portions 13a of the fibers, may be employed an MOST, CCD, BBD, PCD or the like. The image sensor 25 is scanned by clock signals from a second timing circuit 45 so as to output voltages in proportion to the intensities of received laser beams in the time series fashion.

Figure 9:
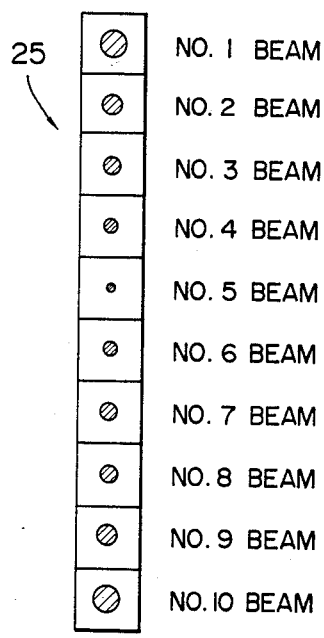
FIG. 9 is a front view of the image sensor.

FIG. 9 illustrates the state of each beam projected on the image sensor 25 when holding the central part (for example, the region corresponding to No. 5 beam) of the image sensor 25 at a position optically and practically equivalent to the position of the fibers, turning the image sensor 25 oblique about the central part in a horizontal plane and then mounting the thus-turned image sensor 25 on the movable carrier 14.

Figure 10:
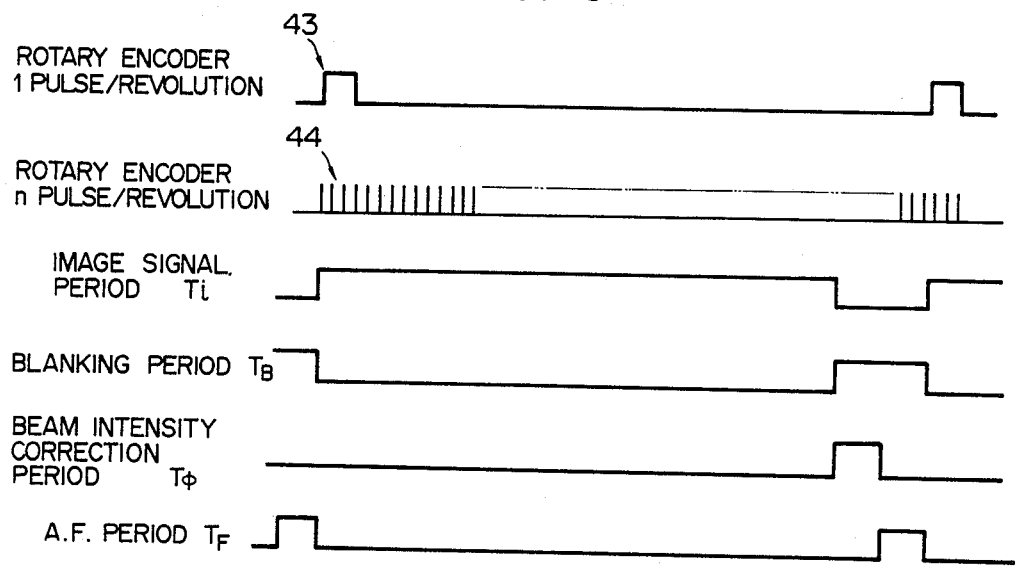
FIG. 10 is a time chart of signals produced during a single rotation of the recording drum.

FIG. 10 is a timing chart showing the timing of various functions which take place while the recording drum 16 rotates once.

The image signal period $T_i$ indicates a time period during which the circumferential length of the film 15 applied on the recording drum 16 is scanned by the projection lens 18. On the other hand, the blanking period $T_B$ means a time period during which a portion 16a of the drum 16, which portion is not applied with the film 15, is scanned (see, FIG. 8). The blanking period $T_B$ is divided further into the beam intensity correction period $T_\phi$ and A.F. (focus adjustment) period $T_F$.

During a certain time period of each single rotation of the drum (namely, in the beam intensity correction period $T_\phi$), the correction of the beam intensity of the optical fibers 9a-9j is carried out. In the other time period (the image signal period $T_i$), the beam intensities of the optical fibers are maintained constant.

Therefore, output beams of the projection lens 18 are always kept table owing to below-described functions even if the intensity of each beam undergoes minute variations while the recording drum 16 rotates.

In FIG. 8, controllers for acousto-optic light modulators, namely, AOM drivers 46a-46j are connected respectively to the $AOM_1$ 5a-$AOM_{10}$ 5j so that RFs (ultrasonic waves) are input to the $AOM_1$ 5a-$AOM_{10}$ 5j to optically modulate the AOMs. Each of the AOM drivers 46a-46j is ON/OFF-controlled by an image signal 47 which has been modulated by its corresponding halftone signal, whereby recording a picture on the film 15.

Figure 13:
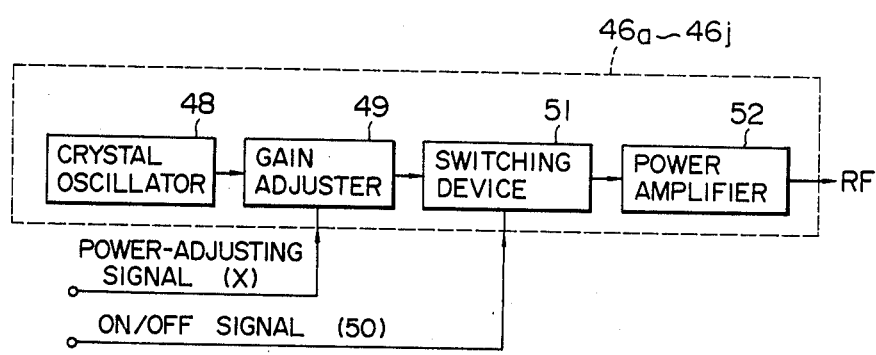
FIG. 13 is a block diagram showing the construction of an AOM driver.

FIG. 13 illustrates the construction of each of the AOM drivers 46a-46j.

Namely, each of the AOM drivers is constructed of a crystal oscillator 48 generating a constant frequency, a gain adjuster 49 adapted to change the magnitude of an output signal ultrasonic power (R.F.) in accordance with each input, namely, the level of each input to a power adjuster X, a switching device 51 and a power amplifier 52.

During the image signal period $T_i$ (see, FIG. 10), the levers of switches 53 shown in FIG. 8 are in the same positions as illustrated in the same drawing and ON-/OFF signals 50 for the image signals 47 are input to the switching devices 51, thereby carrying out the recording of the image on the film 15. During this period of time, the power adjuster X and output signal R.F. are maintained constant.

When the projection lens 18 corresponds to the blanking period $T_B$, the lever of each switch 53 (see, FIG. 8) is switched over to the H-side so that the switching device 51 is turned on. In other words, the AOM drivers 46a-46j are continuously maintained in ON state during the blanking period $T_B$. During the same time period, the level of the power adjuster X is changed by a below-described function, thereby changing the R.F. value to be output from each of the AOM drivers 46a-46j.

Owing to a variation of the R.F. value input to each of the AOMs 5a-5j, the modulation efficiency of each of the AOMs is also changed. Thus, the intensity of the laser beam output from each of the AOMs 5a-5j, namely, the intensity of the laser beam output from each of the optical fibers 9a-9j can be changed.

Figure 14:
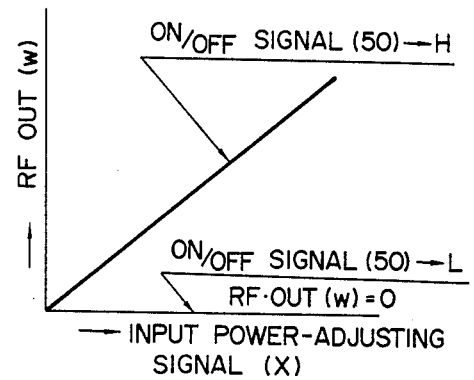
FIG. 14 is a graphic representation showing the relationship between output signals of the AOM driver and the power adjuster.

FIG. 14 illustrates diagrammatically the relationship between the power adjuster X and output signal R.F. when the ON/OFF signal 50 is H (high) during the blanking period $T_B$. When the ON/OFF signal 50 is L (low), the output signal R.F. is 0.

When the tip portions 13a of the optical fibers move in the direction indicated by the arrow 23 together with the movable carrier 14 in FIG. 8, the spectrum pattern of each optical fiber changes and the intensity of each laser beam output from the projection lens 18 hence varies. Thus, it is necessary to correct the intensity of the beam output from each of the optical fibers 9a-9j. Next, the principle of this beam intensity correction will be described.

It is now assumed that, in FIG. 8, the beam intensity feed back system is adopted for both Ar+ laser 1 and Ar+ power supply 1a and the laser beams 4a-4j are kept in stable state.

Let's now suppose that the optical modulation characteristics of the power adjust X be expressed by f(X) as a whole when the input of the ON/OFF control shown in FIG. 13 is ON.

Accordingly, the following relationship is established:

$$I_2 = I_1 \cdot f(X) \tag{1}$$

where
$I_2$: the intensity of a laser beam output from each AOM; and
$I_1$: the intensity of a laser beam input to the AOM.

In the above equation, f(X) indicates table characteristics.

Turning next to the optical fiber transmission system, the optical fibers 9a-9j produce individually a stable and constant extent of attenuation, because laser beams are allowed to enter their corresponding optical fibers after the incident efficiencies of laser beams to their corresponding optical fibers 9a-9j have been controlled by reducing their intensities respectively in accordance with the numerical apertures inherent to the optical fibers.

The laser beams, which have passed respectively through the tip portions 13a of the optical fibers, produce a spectrum pattern owing to the interfering capability of each of the laser beams 4a-4j. The spectrum pattern changes as the tip portions 13 of the optical fibers move.

Whenever this change occurs in the pattern, the beam intensity is changed. The beam intensity correction is applied to this change in beam intensity.

Accordingly, supposing the intensity of a beam output from the projection lens 18 be $I_3$, the following equation is derived:

$$I_3 = I_1 \cdot f(X) \cdot \alpha \tag{2}$$

In the above equation, $\alpha$ is expressed by the product of the attenuation coefficient $\alpha_1$ of beam intensity by the fiber spectrum pattern and the other attenuation coefficient $\alpha_2$, namely, $\alpha = \alpha_1 \cdot \alpha_2$.

The above $\alpha_1$ does not show any attenuation characteristics expressible generally by some parameters in the form of a function but should be considered to be random characteristics.

In order to make $I_3$ constant for performing correct recording on the film 15, two methods may be contemplated, one effecting it by changing $I_2$ in the above equation (2) and the other achieving it by varying f(X) in the above equation (2). In the present embodiment, a description will be made supposing that $I_3$ is kept constant by changing f(X).

Namely, the optical modulation characteristics f(X) is corrected to a desired value by changing the power adjuster X to a desired value and hence varying the output signal R.F. of each of the AOM drivers 46a-46j, thereby making $I_1 f(X) \cdot \alpha$ constant. This maintains the intensity $I_3$ of each beam output from the lens at a constant level. The beam is then received at the image sensor 25. Here, the output voltage 54 of the image sensor, which voltage is obtained by photoelectrically converting the input beam, is generally expressed by the following equation:

$$V = k \cdot I_3$$

However, it is now assumed for the simplification of discussion that the output voltage 54 is expressed by the following equation:

$$V = I_3$$

The extent $\alpha$ of attenuation in the spectrum pattern of each optical fiber varies over the range of $\alpha_{max}-\alpha_{min}$ with $\alpha_0$ being as the central value. Under these conditions, the state of $I_3$ is as shown in FIG. 6.

Let's now assume that the following relationship is estalished when $\alpha=\alpha_0$.

$$I_{30}=I_1(X_0)\cdot\alpha_0 \qquad (3)$$

where $I_{30}$: the standard beam intensity for the beam output from the lens. The value $X_0$ satisfying the equation (3) is now employed as the standard datum $X_0$ 56 (see, FIG. 11).

Since the intensity $I_3$ of the beam output from the lens increases or decreases from the value $I_{30}$ as the movable carrier 14 moves, it is necessary to change the power adjuster X from the value $X_0$ to a desired value in accordance with the increase or decrease of the intensity $I_3$ of the beam output from the lens so that the power adjuster X may be controlled to make the intensity $I_3$ equal to the standard beam intensity $I_{30}$ after the completion of movement of the movable carrier 14.

In other words, it is necessary to determine the value of the power adjuster X which value is to be input to the AOM driver for obtaining, from the AOM driver, such an output signal R.F. as to make the intensity of the beam output from the lens euqal to $I_{30}$.

Paying now attention to one of the beams No. 1–No. 10 of FIG. 10, its beam intensity and the value of the power adjuster X for its corresponding AOM driver at the same time point will next be investigated.

A function table $$\frac{I_1\alpha_0 \cdot f(X)}{I_{30}}$$

standardized by $I_{30}$, in which function table $\alpha_0$ and f(X) satisfy the equation (3), is stored as a standard data table 57 (see, FIG. 11) in terms of values corresponding to Xs.

Figure 7:
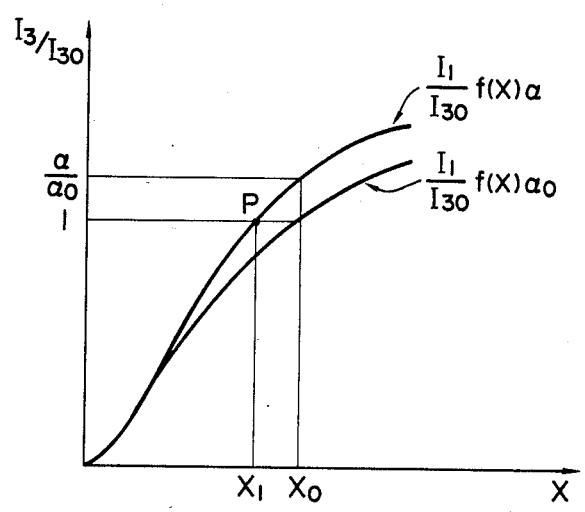

FIG. 7 shows a graph standardized by $I_{30}$.

Figure 1:
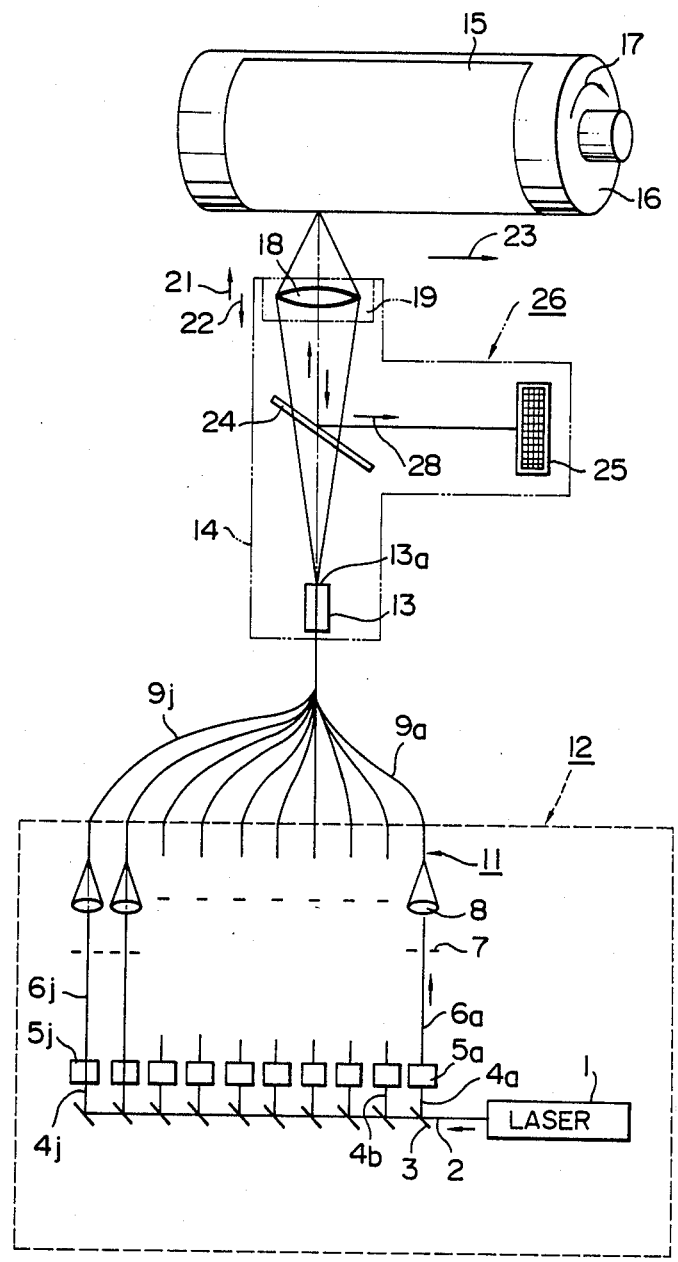
FIG. 1 is a plan view showing the outline of the recording unit of a picture scanning and recording system which has been so designed as to enable the practice of the method of this invention.
Figure 6:
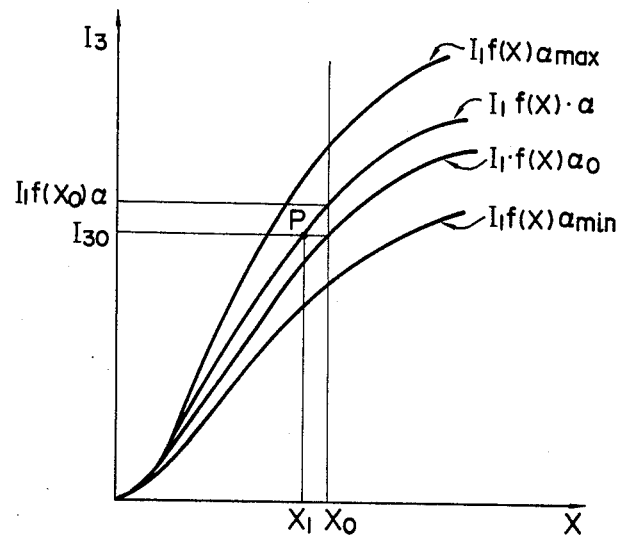
FIGS. 6 and 7 are each diagram illustrating the relationship between the intensity of each beam output from the lens and a power adjuster.

In FIG. 6, the value X at the point P where $I_1f(X)\alpha=I_{30}$ is the value $X_1$ to be determined. A description will next be made on a method for determining the value $X_1$.

Between the image sensor 25 and AOM drivers 46a–46j illustrated in FIG. 8, there are provided a correction circuit 58 and register 59 as well as auxiliary circuits 61 which consist of the same circuits and are connected respectively to the AOM drivers 46a–46j.

Figure 11:
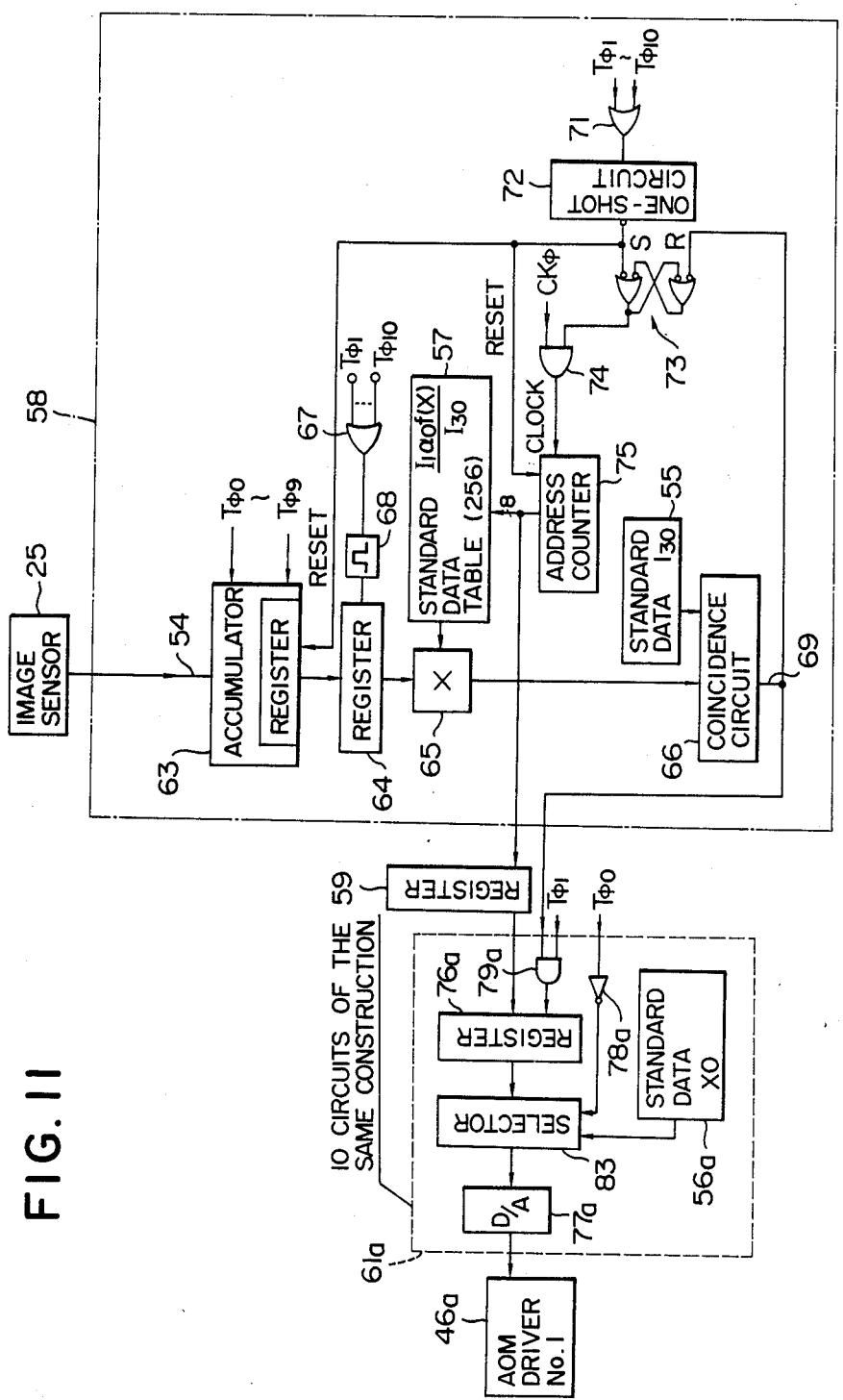
FIG. 11 is a circuit diagram for correcting each varied beam intensity.
Figure 12:
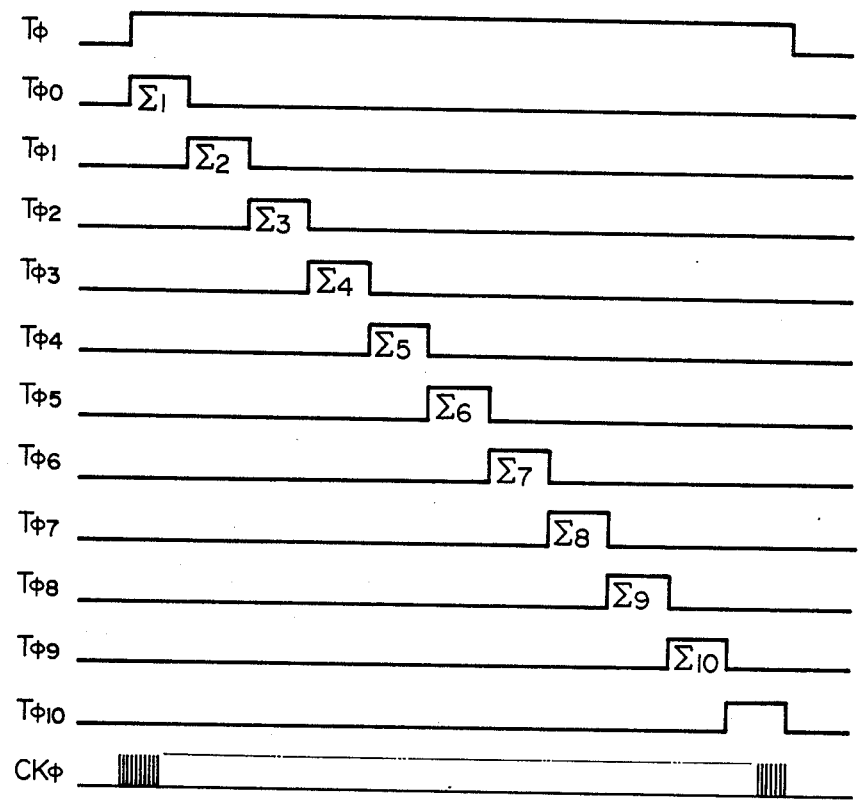
FIG. 12 is a timing chart covering a beam intensity correction period.

FIG. 11 illustrates the above circuits 58, 61 in detail. FIG. 12 shows a timing chart of the circuits.

In the beam quantity correction period $T_\phi$ shown in FIG. 12 (reference is also made to FIG. 10), pulses $T_{\phi 0}-T_{\phi 10}$ which have been obtained as a result of a control made by a clock pulse $C_{K\phi}$ of a first timing circuit 62 (see, FIG. 8) are input to the correction circuit 58.

In FIG. 11, an accumulator 63 accumulates beam intensities by the regions (i.e., by the regions corresponding the beam numbers shown in FIG. 9) of the image sensor 25 during each of the periods $T_{\phi 0}-T_{\phi 9}$, and then outputs results to the register 64.

Here, the term "beam intensity" means a beam intensity received at the image sensor 25. Beam intensities are indicated by $\Sigma_1-\Sigma_{10}$ in FIG. 12.

A multiplier 65 serves to multiply data read out from the standard data table 57 with data output from the accumulator 63 one by one and then to feed the results to a coincidence circuit.

When reading data out from the standard data table 57, it is required to complete the accumulation. of beam intensities in advance at the accumulator 63. Therefore, the first reading-out period ($T_{\phi 1}$ period) from the standard is delayed b $T_{\phi 0}$ from the timing of the accumulator 63.

An input to an OR circuit 67 is started from $T_{\phi 1}$ which is $T_{\phi 0}$ behind the input to the accumulator 63. Signals are input to the OR circuit 67 until $T_{\phi 10}$. The data of the register 64 are fed to the multiplier 65 upon receipt of signals from a ONE-SHOT circuit 68.

Therefore, the $T_{\phi 0}$ period is a period in which $\Sigma_1$ is calculated. In the $T_{\phi 1}$ period, $\Sigma_2$ is calculated, data are read out from the standard data table 57, and extents of correction are determined for the beam intensities. In each of the periods of $T_{\phi 2}$ and its subsequent periods, the same operation as $T_{\phi 1}$ is performed.

The coincidence circuit 66 compares each calculation result, obtained at the multiplier 65, with the value of the standard data $I_{30}$ 55 and, when the calculation result coincides with the value, produces a pulse 69 so that the address of the standard data table 57 at this time point is stored in the register 59 and a register 76a.

A selector 83 selects the stardard data ($X_0$) during the period $T_{\phi 0}$ in FIG. 12 but chooses output values of the register 76 during the remaining periods. Ten sets of circuits 61a are provided and their clocks are different from one circuit to another.

When the signals of the periods $T_{\phi 1}-T_{\phi 10}$ have been input to the OR circuit 71 and the pulses have been output from the ONE-SHOT circuit 72, a flip-flop 73 is in the SET state and the clock pulses $C_{K\phi}$ input to an AND circuit 74 are counted by an address counter 75.

The result of the above counting corresponds to the value X shown in the graph given in FIG. 7. When the pulse 69 has been output from the coincidence circuit 66 and the flip-flop 73 has been turned to the RESET side, the counting operation of the address counter 75 is finished and the result of the counting is stored in the register 59.

The register 59 is, as illustrated in FIG. 8, connected to the register 76 in each of the auxiliary circuits 61.

In the auxiliary circuit 61a, the data of the standard data $X_0$ 56a, namely, the value $X_0$ is converted into an analog signal by means of a D/A converter 77a and input to the AOM driver 46a during the period $T_{\phi 0}$.

The data of the power adjuster $X_0$ are input to the gain adjuster 49 shown in FIG. 13 and the output R.F., which has been output from the gain adjuster 49, serves to modulate the output of the AOM 5a. At this time point, the overall intensity $\Sigma_1$ of beams output from the lens is expressed on the bases of the equation (3) by the following equation.

$$\Sigma_1 = I_1 f(X_0) \cdot \alpha$$

When the value X (i.e., the value $X_1$ at the point P in FIG. 7) conforming with the standard data $I_{30}$ has been obtained by multiplying $\Sigma_1-\Sigma_{10}$ one by one with values read out from the standard data table 57, the value X is thus the value intended to obtain, namely, a power-adjusting signal $X_1$ to be input to the AOM drivers 46a-46j.

Representing the above relationship by an equation, it is to determine $X_1$ which renders $$(\Sigma_1) \times \left( \frac{I_1 a_0 f(X)}{I_{30}} \right)$$

equal to $I_{30}$. Thus, $$(\Sigma_1) \times \left( \frac{I_1 a_0 f(X_1)}{I_{30}} \right) = I_{30}$$

$$I_1 f(X_0) a \times \frac{I_1 a_0 f(X_1)}{I_{30}} = I_{30}$$

$$\frac{I_0 a_0 f(X_0)}{I_{30}} \times I_1 a f(X_1) = I_{30}$$

Since $$\frac{I_1 a_0 \cdot f(X_0)}{I_{30}} = 1,$$

$$I_1 a f(X_1) = I_{30}$$

The input timing of the above $X_1$ is at the time point when, after passing through the period $T_{\phi 0}$, a signal from and inverter 78, a signal of the value of the counting from the register 59 and, during the period $T_{\phi 0}$, a signal from the AND circuit 79 have all been input to the register 76a.

Similarly, in the period $T_{\phi 2}$, a power-adjusting signal X is input to the AOM driver 46b. The other AOM drivers are also input successively.

The thus-obtained power-adjusting signal X is input to each of the AOM drivers 46a–46j so as to change the modulation efficiencies of the AOMs 5a–5j. Thus, the intensities of output laser beams are changed, thereby automatically correcting the intensity $I_3$ of the laser beam output from each of the fibers 9a–9j and passed through the lens to the standard beam intensity $I_{30}$ required for the exposure of the film in the beam intensity correction period $T_\phi$.

By the way, variations in focal point of the projection lens 18 are also automatically corrected by driving the pulse motor 34 in the A.F. period $T_F$ (see, FIG. 10) by means of the AF circuit 81 and pulse motor drive circuit 82 both illustrated in FIG. 8. However, description of this feature is omitted herein because it is not directly related to the present invention.

In the above description, signals were fed back from the image sensor to AOMs. The intensity of each beam outout from the lens may also be corrected in the same manner, provided that the above signal is fed back to the laser 1.

As has been described above, the intensity of each beam output from the projection lens can be corrected to a standard beam intensity required for the exposure of a film in the beam intensity correction period in the present invention by inputting a power-adjusting signal X, which has been input to each AOM driver when the intensity of each beam output from the projection lens is equal to the standard beam quantity required for the exposure of the film, as a standard datum $X_0$ first to the AOM driver so as to drive its corresponding acousto-optic light modulator (AOM), determining regions of an image sensor, which regions are each illuminated at the standard beam intensity, and power adjusting values Xs when the tip portions of fibers and the projection lens are moved in the sub-scanning direction and the intensities of beams output from the lens are varies, and then inputting the power-adjusting values Xs to the corresponding AOM drivers.

In the above embodiment, AOMs (acousto-optic light modulators) were employed by way of example. The present invention may be practiced by means of EOMs (Electro-optic light modulators) in place of AOMs. On the other hand, an image sensor such as CCD or the like was employed as photoelelctric sensor in the above embodiment. This invention may be equally practiced by using a plurality of single photoelectric sensor units.

The present invention may also be practiced by turning the half mirror 24 of FIG. 8 over 90° from the illustrated state, fixedly providing a suitable lens between the image sensor and half mirror, and then focusing images which have been produced at the tip portions 13a of the fibers on the image sensor. In this modification, each beam travels from its corresponding tip portion 13a, via the half mirror and suitable lens, and to the image sensor.

Having now fully described the invention, it will be apparent to one of ordinary skill in the art that many changes and modifications can be made thereto without departing from the spirit or scope of the invention as set forth herein.

What is claimed is:

1. A method for correcting the beam intensity upon scanning and recording a picture by means of a picture scanning and recording system which produces, on the basis of a picture signal, a halftone signal consisting of at least one parallel operation signal, causing at least one exposing laser beam, which has been modulated by at least one acousto-optic light modulator controlled by the halftone signal, to enter the input terminal of at least one optical fiber, tip portions of the output terminals of which optical fibers are aligned in a row where the system is equipped with more than one optical fiber, and projecting the thus-transmitted beam from the tip portion of the optical fiber on a recording drum, which method comprises:

fixedly providing a half mirror between a lens, which is adapted to focus the thus-transmitted beam on the recording drum, and the tip portion of the optical fiber;

focusing an image, which has been produced at the tip portion of the optical fiber, on at least one photo-electric sensor via the half mirror; and feeding an output signal of the photoelectric sensor, which output signal varies when the spectrum pattern on each output of the optical fiber varies as the output terminal of the optical fiber moves and the optical axis of the optical fiber thus changes, back to the acousto-optic light modulator so that the intensity of the exposing laser beam is corrected to the standard beam intensity required to expose a photosensitive material applied on the recording drum;

the beam intensity of the output from each optical fiber being corrected to the standard beam intensity $I_{30}$ by:

determining the beam intensity $I_3$ of the lens output, which beam intensity $I_3$ is expressed by the following equation:

$$I_3 = I_1 f(X)\alpha$$

where
- $I_1$: the beam intensity of the laser beam input to the acousto-optic light modulator;
- $I_3$: the beam intensity of the laser beam output from the acousto-optic light modulator;
- $f(X)$: the modulation characteristics of the acousto-optic light modulator;
- $\alpha$: the extent of attenuation of the optical fiber;
- $X$: an input fed to a controller for each acousto-optic light modulator so as to change the output of the acousto-optic light modulator, as well as the central value $\alpha_0$ of $\alpha$ and $X_0$ when the beam intensity $I_3$ of the output of the lens is equal to the standard beam intensity $I_{30}$ required to expose the photosensitive material, namely, when $I_{30} = I_1 f(X_0)\alpha_0$;

employing $X_0$ as a standard datum $X_0$;

establishing a standard data table $$\frac{I_1 \alpha_0 f(X)}{I_{30}};$$

feeding $X_0$ to the controller for the acousto-optic modulator and measuring the beam intensity of the output of the acousto-optic light modulator upon scanning a surface of the recording drum on which surface the photosensitive material is not applied;

obtaining, as $X_1$, the value $X$ when the product obtained by multiplying the beam intensity with the standard data table $$\frac{I_1 \alpha_0 f(X)}{I_{30}}$$

is equal to $I_{30}$, namely, when $$\frac{I_1 \alpha_0 f(X)}{I_{30}} \times I_1 \cdot \alpha f(X_0) = I_{30}$$

and then feed $X$ to the acousto-optic light modulator.

* * * * *